US010096485B2

(12) United States Patent
Fukumaki

(10) Patent No.: US 10,096,485 B2
(45) Date of Patent: Oct. 9, 2018

(54) SEMICONDUCTOR DEVICE AND METHOD OF MANUFACTURING THE SAME

(71) Applicant: TOSHIBA MEMORY CORPORATION, Minato-ku (JP)

(72) Inventor: Naomi Fukumaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 42 days.

(21) Appl. No.: 14/747,261

(22) Filed: Jun. 23, 2015

(65) Prior Publication Data
US 2016/0247755 A1     Aug. 25, 2016

Related U.S. Application Data

(60) Provisional application No. 62/118,256, filed on Feb. 19, 2015.

(51) Int. Cl.
| | |
|---|---|
| *H01L 21/768* | (2006.01) |
| *H01L 21/4763* | (2006.01) |
| *H01L 23/48* | (2006.01) |
| *H01L 23/52* | (2006.01) |
| *H01L 21/3105* | (2006.01) |
| *H01L 23/522* | (2006.01) |
| *H01L 23/532* | (2006.01) |

(52) U.S. Cl.
CPC .... *H01L 21/31051* (2013.01); *H01L 21/7682* (2013.01); *H01L 21/76802* (2013.01); *H01L 23/5222* (2013.01); *H01L 23/53295* (2013.01); *H01L 23/53238* (2013.01)

(58) Field of Classification Search
CPC ................................................ H01L 21/31051

USPC ......................................................... 257/774
See application file for complete search history.

(56) References Cited

U.S. PATENT DOCUMENTS

| | | | | |
|---|---|---|---|---|
| 5,837,618 | A | * 11/1998 | Avanzino | .......... H01L 21/02164 438/778 |
| 5,960,311 | A | * 9/1999 | Singh | ...................... H01L 21/31 257/E21.24 |
| 6,162,723 | A | * 12/2000 | Tanaka | ................. H01L 21/7682 257/E21.581 |
| 6,949,456 | B2 | 9/2005 | Kumar | |
| 8,399,349 | B2 | 3/2013 | Vrtis et al. | |
| 2009/0087977 | A1* | 4/2009 | Spuller | ............... C23C 16/0272 438/593 |
| 2009/0093112 | A1* | 4/2009 | Al-Bayati | ........... H01L 21/3105 438/618 |

(Continued)

FOREIGN PATENT DOCUMENTS

| | | |
|---|---|---|
| JP | 2004-153280 | 5/2004 |
| JP | 2008-010534 | 1/2008 |
| JP | 5485953 | 5/2014 |

*Primary Examiner* — Joseph C Nicely
*Assistant Examiner* — Thai T Vuong
(74) *Attorney, Agent, or Firm* — Oblon, McClelland, Maier & Neustadt, L.L.P.

(57) ABSTRACT

In one embodiment, a method of manufacturing a semiconductor device includes forming a plug in a first insulator, forming a first film on the first insulator and the plug, and forming an opening in the first film. The method further includes forming a second insulator in the opening to form an air gap in the opening, removing the first film after forming the second insulator, to expose the plug, and forming an interconnect on the exposed plug.

4 Claims, 8 Drawing Sheets

(56) References Cited

U.S. PATENT DOCUMENTS

| | | | | |
|---|---|---|---|---|
| 2011/0021017 A1* | 1/2011 | Ueda | ............ | H01L 21/76801 438/622 |
| 2013/0119550 A1* | 5/2013 | Hayashi | ............ | H01L 21/76885 257/773 |
| 2013/0267088 A1* | 10/2013 | Baek | ............ | H01L 21/76802 438/637 |
| 2014/0065818 A1* | 3/2014 | Lu | ............ | H01L 21/76885 438/653 |
| 2014/0242792 A1* | 8/2014 | Liu | ............ | H01L 21/7682 438/624 |
| 2015/0102496 A1* | 4/2015 | Zhang | ............ | H01L 23/5226 257/774 |
| 2015/0137375 A1* | 5/2015 | Chen | ............ | H01L 23/53238 257/751 |

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/118,256 filed on Feb. 19, 2015, the entire contents of which are incorporated herein by reference.

FIELD

Embodiments described herein relate to a semiconductor device and a method of manufacturing the same.

BACKGROUND

In recent years, there has been a request to form an air gap between copper (Cu) interconnects. For example, the air gap can be formed by forming the Cu interconnects in a sacrificial film, removing the sacrificial film after forming the Cu interconnects, and forming an insulator having a poor filling property on the Cu interconnects after removing the sacrificial film. However, the Cu interconnects in this case may dissolve or disappear when removing the sacrificial film by wet etching or the like. A similar problem may occur in a case of forming an air gap between interconnects other than the Cu interconnects.

DETAILED DESCRIPTION

Embodiments will now be explained with reference to the accompanying drawings.

In one embodiment, a method of manufacturing a semiconductor device includes forming a plug in a first insulator, forming a first film on the first insulator and the plug, and forming an opening in the first film. The method further includes forming a second insulator in the opening to form an air gap in the opening, removing the first film after forming the second insulator, to expose the plug, and forming an interconnect on the exposed plug.

(First Embodiment)

FIGS. 1A to 3B are cross-sectional views showing a method of manufacturing a semiconductor device of a first embodiment.

Figure 4A:
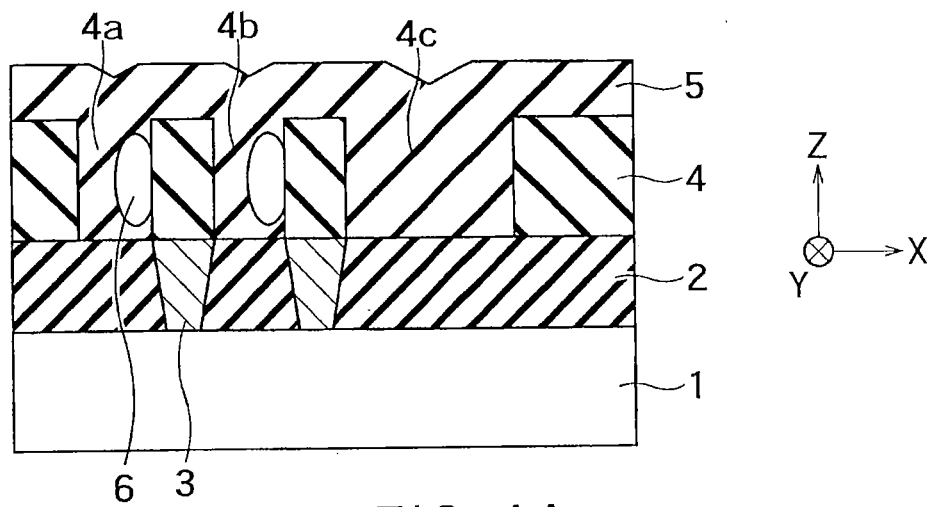
FIGS. 4A and 4B are cross-sectional views to explain air gaps in the first embodiment.
Figure 4B:
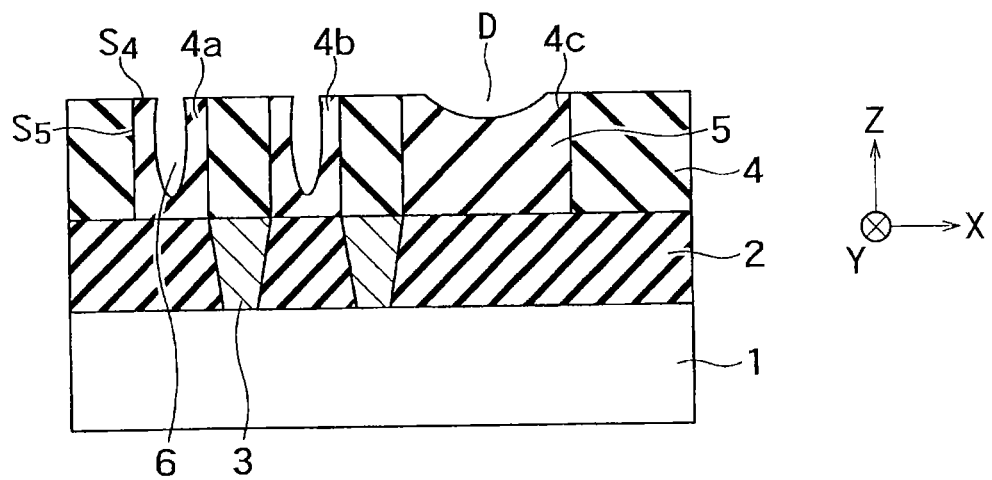

FIGS. 4A and 4B are cross-sectional views to explain air gaps in the first embodiment.

[FIG. 1A]

Figure 1A:
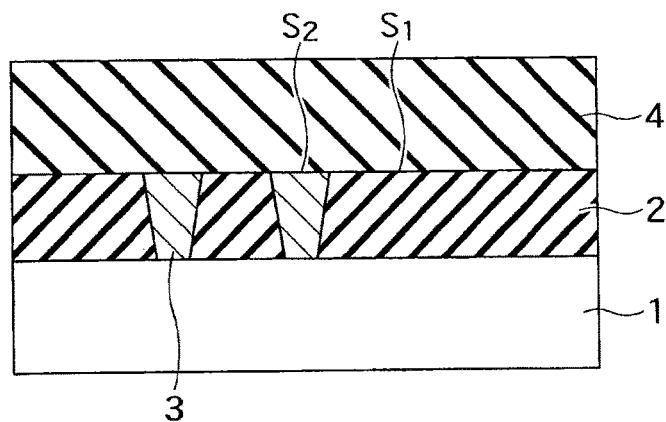
FIGS. 1A to 3B are cross-sectional views showing a method of manufacturing a semiconductor device of a first embodiment.

First, a first insulator 2 is formed on a substrate 1, contact plugs 3 are formed in the first insulator 2, and a sacrificial film 4 is formed on the first insulator 2 and the contact plugs 3 (FIG. 1A). The contact plugs 3 are an example of a plug of the disclosure. The sacrificial film 4 is an example of a first film of the disclosure.

The substrate 1 has a structure, for example, including a semiconductor substrate, such as a silicon substrate, and one or more interconnect layers formed on the semiconductor substrate. FIG. 1A indicates an X direction and a Y direction that are parallel to a surface of the substrate 1 and vertical to each other, and a Z direction vertical to the surface of the substrate 1. A +Z direction is herein treated as an upward direction, and a −Z direction is treated as a downward direction. For example, positional relation between the substrate 1 and the first insulator 2 is described as that the substrate 1 is situated downward of the first insulator 2. In addition, the −Z direction in the present embodiment may accord with a gravity direction, or may not accord with the gravity direction.

An example of the first insulator 2 is a silicon oxide film. The first insulator 2 may be formed on the substrate 1 directly, or may be formed on the substrate 1 via another layer. The first insulator 2 may be a laminated film including a plurality of insulators. The first insulator 2 is, for example, an inter layer dielectric.

An example of each contact plug 3 is a tungsten (W) layer. The contact plugs 3 in the present embodiment are formed by forming contact holes to penetrate the first insulator 2, filling plug material of the contact plugs 3 into the contact holes, and removing excess plug material outside the contact holes. Therefore, each contact plug 3 in the present embodiment has an upper face $S_2$ as high as an upper face $S_1$ of the first insulator 2 when the process of FIG. 1A is finished. The contact plugs 3 are, for example, electrically connected with an interconnect layer in the substrate 1.

An example of the sacrificial film 4 is a silicon nitride film or an amorphous silicon film.

[FIG. 1B]

Figure 1B:
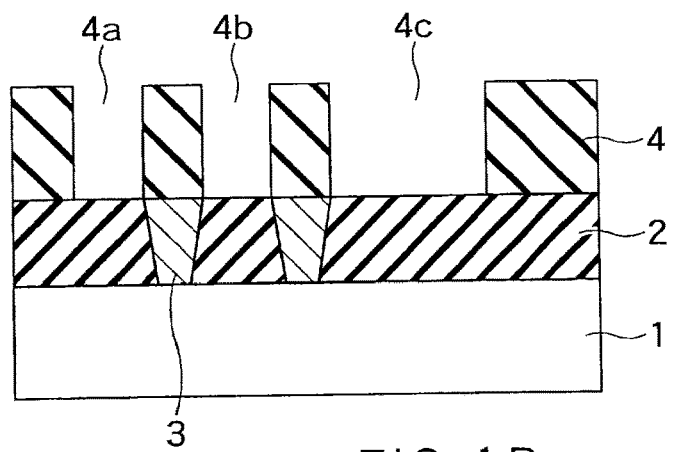

Next, openings 4a to 4c are formed in the sacrificial film 4 by lithography and reactive ion etching (RIE) (FIG. 1B). Consequently, the first insulator 2 is exposed in the openings 4a to 4c. The openings 4a to 4c in the present embodiment have a shape extending in the Y direction.

[FIG. 1C]

Figure 1C:
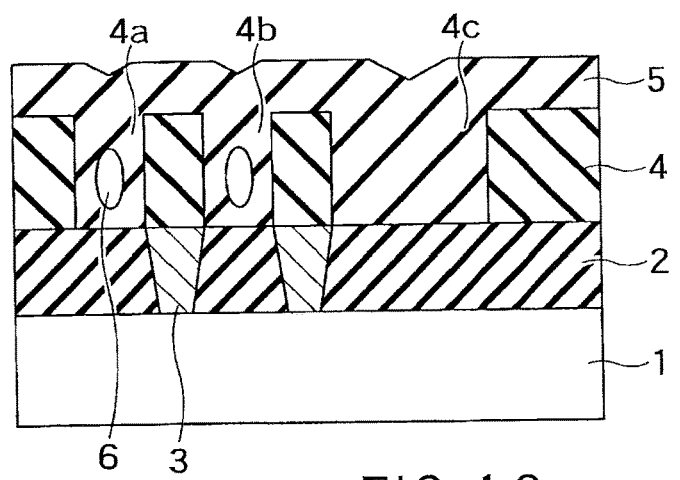

Next, a second insulator 5 is formed on the whole surface of the substrate 1 (FIG. 1C). Consequently, the openings 4a to 4c are filled with the second insulator 5. The second insulator 5 in the present embodiment is formed such that air gaps 6 are formed in the openings 4a and 4b. For example, the air gaps 6 can be formed by using, as the second insulator 5, an insulator having a poor filling property. An example of the second insulator 5 is a silicon oxide film.

The width of the opening 4c in the present embodiment is set wider than widths of the openings 4a and 4b. Therefore, in the process of FIG. 1C, no air gap 6 is formed in the opening 4c.

The air gaps 6 in the present embodiment are preferably formed so as not to contact the sacrificial film 4. The reason is that if the air gaps 6 are in contact with the sacrificial film 4 as in FIG. 4A, the air gaps 6 will be exposed after the sacrificial film 4 is removed. In this case, there is a possibility that interconnect material or the like gets into the air gaps 6. In addition, positions and sizes of the air gaps 6 can be controlled, for example, by adjusting formation speed of the second insulator 5.

[FIG. 2A]

Figure 2A:
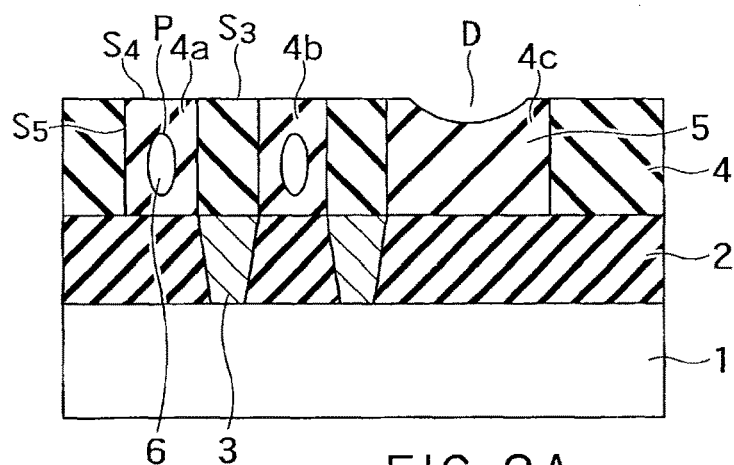

Next, a surface of the second insulator 5 is planarized by chemical mechanical polishing (CMP) (FIG. 2A). Consequently, an upper face $S_3$ of the sacrificial film 4 is exposed.

Reference characters $S_4$ and $S_5$ respectively indicate an upper face and a side face of the second insulator 5 in each opening 4a, 4b.

The second insulator 5 in the present embodiment is preferably planarized so as not to expose the air gaps 6 out of the second insulator 5. The reason is that if the air gaps 6 are exposed out of the second insulator 5 as in FIG. 4B, there is a possibility that the interconnect material or the like gets into the air gaps 6. On the other hand, an upper end P of each air gap 6 in the FIG. 2A is lower than the upper face $S_4$ of the second insulator 5, and the air gaps 6 are not exposed out of the second insulator 5. Such air gaps 6 can be formed, for example, by adjusting the formation speed of the second insulator 5 in the process of FIG. 1C.

[FIG. 2B]

Figure 2B:
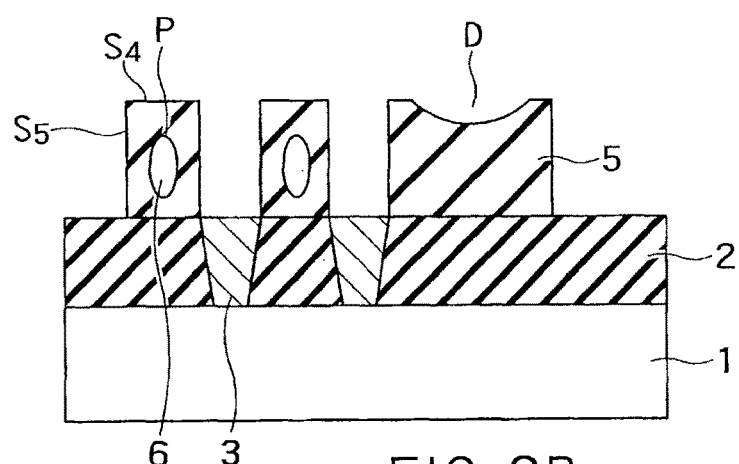

Next, the sacrificial film 4 is removed by wet etching (FIG. 2B). Consequently, the contact plugs 3 are exposed. If the sacrificial film 4 is a silicon nitride film, an example of chemical solution for wet etching is phosphoric acid. If the sacrificial film 4 is an amorphous silicon film, an example of chemical solution for wet etching is TMY (trimethyl(2-hydroxyethyl)ammonium hydroxide). If the contact plug 3 is a W (tungsten) layer, using phosphoric acid or TMY allows the sacrificial film 4 to be removed hardly dissolving the contact plugs 3.

[FIG. 2C]

Figure 2C:
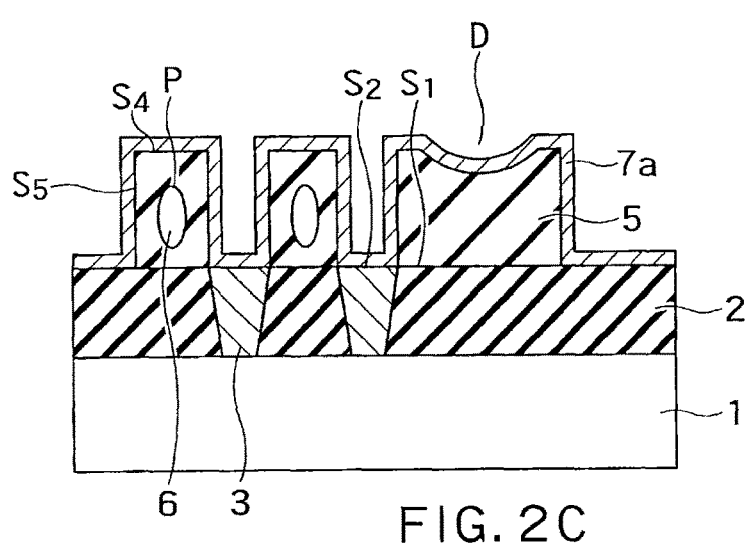

Next, a first interconnect material 7a is formed on the whole surface of the substrate 1 (FIG. 2C). Consequently, the first interconnect material 7a is formed on the upper face $S_2$ of each contact plug 3, and the upper face $S_4$ and the side face $S_5$ of the second insulator 5. The first interconnect material 7a is an example of a first layer of the disclosure. The first interconnect material 7a is, for example, a titanium (Ti) layer or tantalum (Ta) layer. The first interconnect material 7a functions as a barrier metal layer.

[FIG. 3A]

Figure 3A:
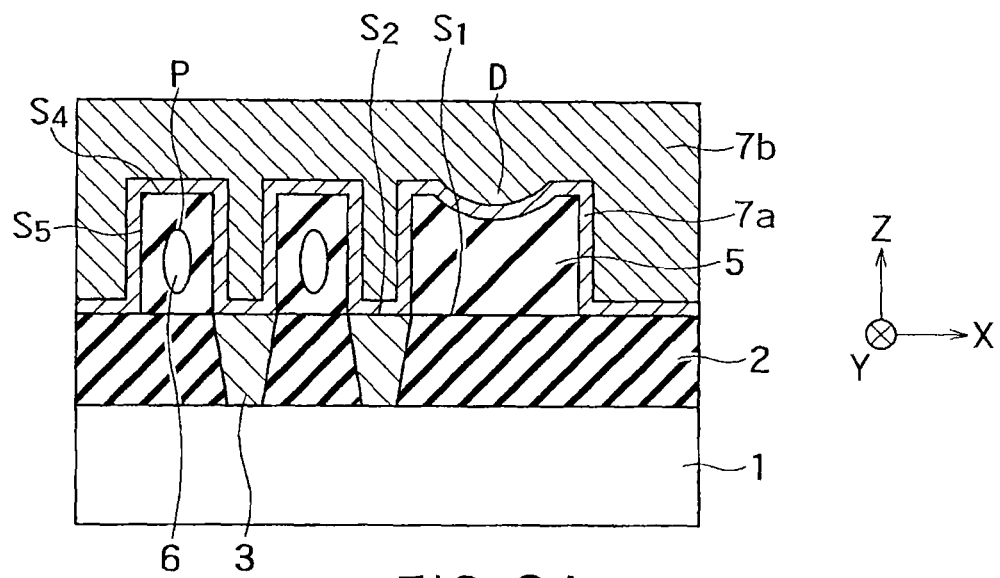

Next, a second interconnect material 7b is formed on the whole surface of the substrate 1 (FIG. 3A). Consequently, the second interconnect material 7b is formed on the upper face $S_2$ of each contact plug 3, and the upper face $S_4$ and the side face $S_5$ of the second insulator 5 via the first interconnect material 7a. The second interconnect material 7b is an example of a second layer of the disclosure. The second interconnect material 7b is, for example, a copper (Cu) layer.

[FIG. 3B]

Figure 3B:
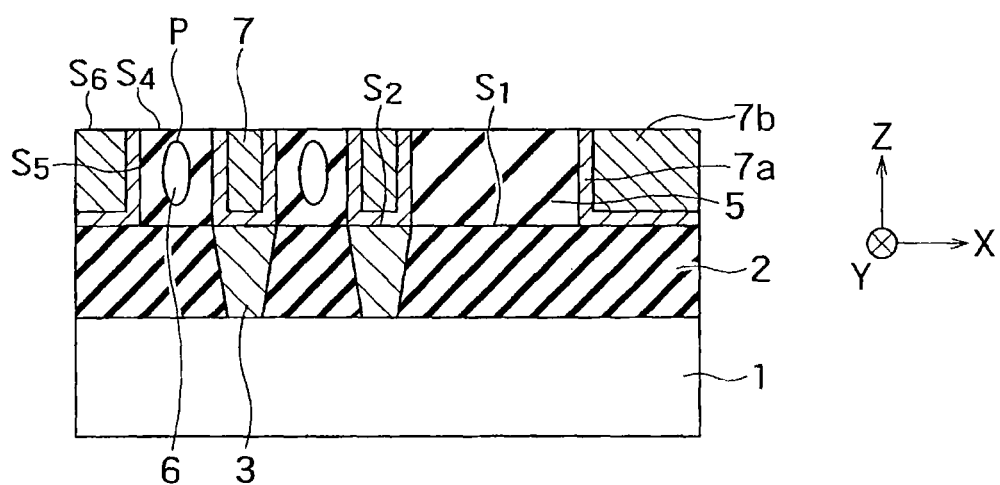

Next, surfaces of the first and second interconnect materials 7a and 7b are planarized by CMP (FIG. 3B). Consequently, interconnects 7 including the first and second interconnect materials 7a and 7b are formed on the contact plugs 3. The first and second interconnect materials 7a and 7b in the present embodiment are planarized until the upper face $S_4$ of the second insulator 5 is exposed. Consequently, height of an upper face $S_6$ of each interconnect 7 becomes the same as the height of the upper face $S_4$ of the second insulator 5. Each interconnect 7 in the present embodiment has a shape extending in the Y direction.

The air gaps 6 in the present embodiment are not in contact with the interconnects 7. This arises from the air gaps 6 in FIG. 1C being not in contact with the sacrificial film 4. Note that in the present embodiment, the first and second interconnect materials 7a and 7b have not gotten into the air gaps 6.

Each interconnect 7 in the present embodiment is formed adjacent to the second insulator 5. Therefore, the interconnects 7 in the present embodiment are adjacent to each other via an air gap 6 formed in the second insulator 5. In this way, the present embodiment can form the interconnects 7 after forming the second insulator 5 including the air gaps 6.

In the process of FIG. 2B of the present embodiment, the sacrificial film 4 can be removed hardly dissolving the contact plugs 3. Consequently, even after the process of FIG. 2B, the height of the upper face $S_2$ of each contact plug 3 is nearly the same as the height of the upper face $S_1$ of the first insulator 2, and difference in levels between the upper face $S_1$ and the upper face $S_2$ hardly occurs. For example, such a configuration has the advantages of being able to improve filling properties of the first and second interconnect materials 7a and 7b into the second insulator 5, and to improve reliability of the interconnects 7.

Thereafter, various layers such as inter layer dielectrics, plug layers, and interconnect layers are formed on the substrate 1 in the present embodiment. In this way, the semiconductor device in the present embodiment is manufactured.

[Comparative Example to First Embodiment]

Figure 5A:
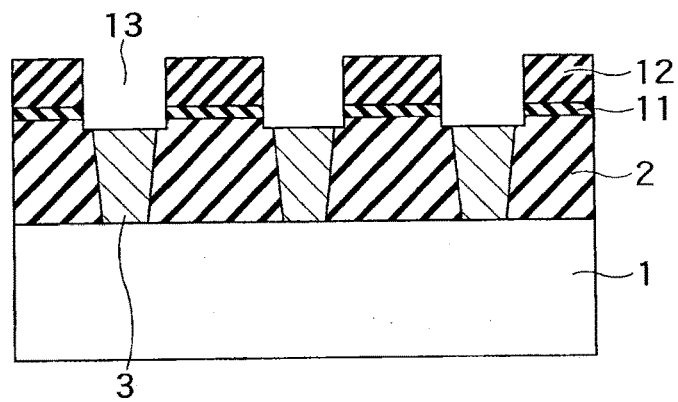
FIGS. 5A to 5C are cross-sectional views to explain a problem of a method of manufacturing a semiconductor device of a comparative example to the first embodiment.
Figure 5B:
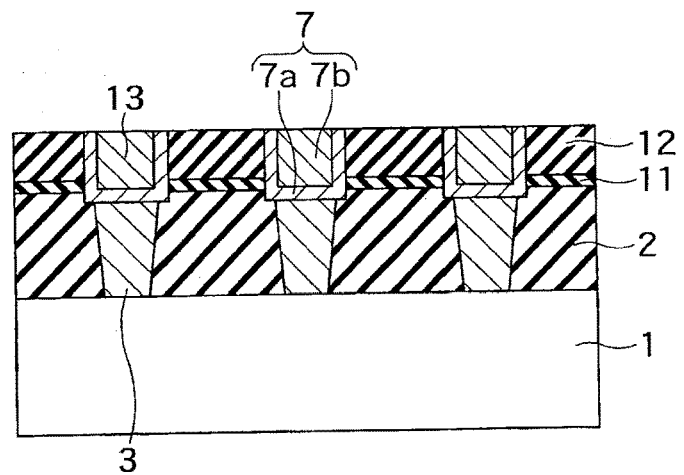
Figure 5C:
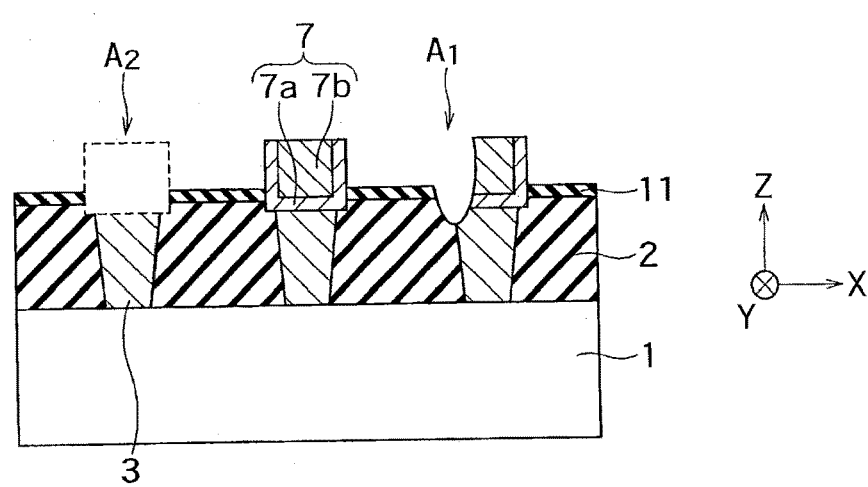

FIGS. 5A to 5C are cross-sectional views to explain a problem of a method of manufacturing a semiconductor device of a comparative example to the first embodiment.

The comparative example first forms a first insulator 2 on a substrate 1, forms contact plugs 3 in the first insulator 2, forms a base film 11 and a sacrificial film 12 on the first insulator 2 and the contact plugs 3, and forms openings 13 in the base film 11 and the sacrificial film 12 (FIG. 5A). Consequently, the contact plugs 3 are exposed in the openings 13. An example of the base film 11 is a silicon nitride film. An example of the sacrificial film 12 is a silicon oxide film.

Next, interconnects 7 each including a first interconnect material 7a and a second interconnect material 7b is formed on the contact plugs 3 in the openings 13 (FIG. 5B).

Next, the sacrificial film 12 is removed by wet etching (FIG. 5C). If the sacrificial film 12 is a silicon oxide film, an example of chemical solution for wet etching is diluted fluoric acid. Thereafter, air gaps are formed between the interconnects 7 by forming an insulator having a poor filling property on the interconnects 7.

In the comparative example, when the sacrificial film 12 is removed by wet etching, there is a possibility that dissolution or disappearance of the interconnects 7 may occur. An arrow $A_1$ indicates an example of a dissolved interconnect 7. An arrow $A_2$ indicates an example of an interconnect 7 having disappeared.

On the other hand, in the present embodiment, the openings 4a and 4b are formed in the sacrificial film 4, the second insulator 5 including the air gaps 6 is formed in the openings 4a and 4b, the sacrificial film 4 is removed after forming the second insulator 5, and the interconnects 7 are formed after removing the sacrificial film 4. Therefore, because the interconnects 7 do not exist yet when the sacrificial film 4 in the present embodiment is removed, the present embodiment can avoid causing the interconnects 7 to dissolve or disappear at the time of removing the sacrificial film 4. Therefore, the present embodiment enables forming the air gaps 6 between the interconnects 7 while preventing the dissolution and disappearance of the interconnects 7.

(Second Embodiment)

FIGS. 6A to 8B are cross-sectional views showing a method of manufacturing a semiconductor device of a second embodiment. In the description of the present embodiment, explanation will be omitted about the matters common to the first embodiment.

Figure 6A:
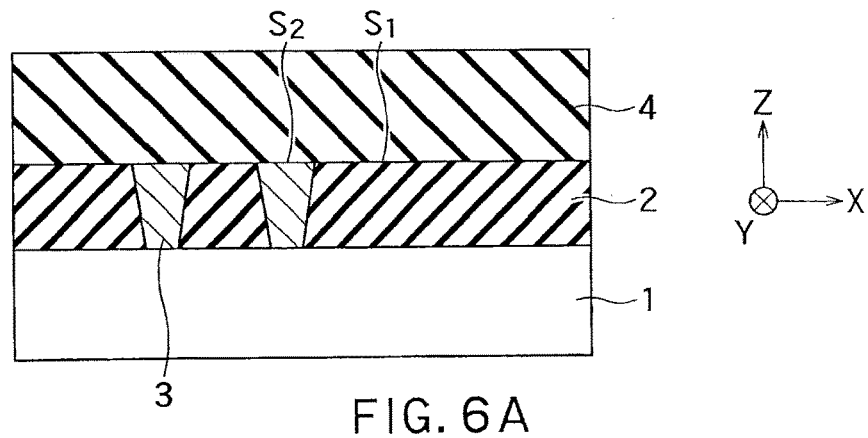
FIGS. 6A to 8B are cross-sectional views showing a method of manufacturing a semiconductor device of a second embodiment.

First, a first insulator 2 is formed on a substrate 1, contact plugs 3 are formed in the first insulator 2, and a sacrificial film 4 is formed on the first insulator 2 and the contact plugs 3 (FIG. 6A).

Figure 6B:
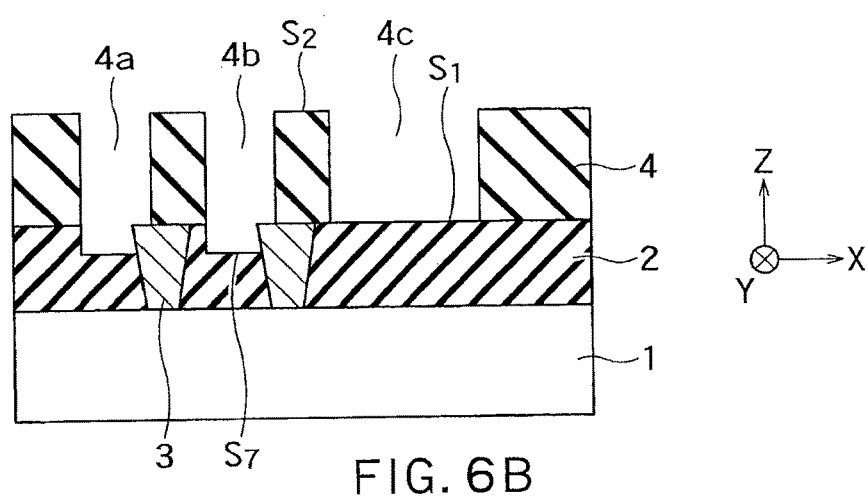

Next, openings 4a to 4c are formed in the sacrificial film 4 by lithography and RIE (FIG. 6B). However, due to misalignment in lithography, the first insulator 2 and the contact plugs 3 are exposed in the openings 4a and 4b in the present embodiment. Furthermore, due to difference between etching rates of the first insulator 2 and the contact plugs 3, a bottom face $S_7$ of each opening 4a, 4b becomes lower than an upper face $S_2$ of each contact plug 3.

Figure 6C:
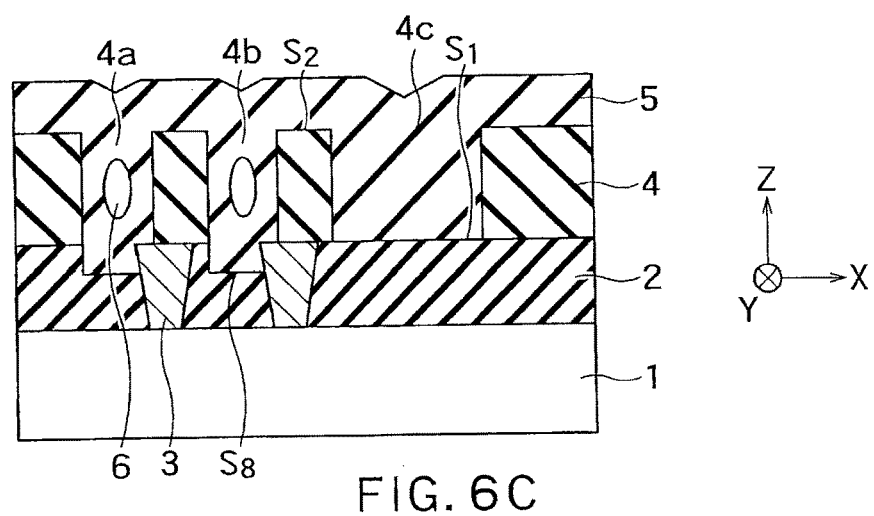
Figure 7A:
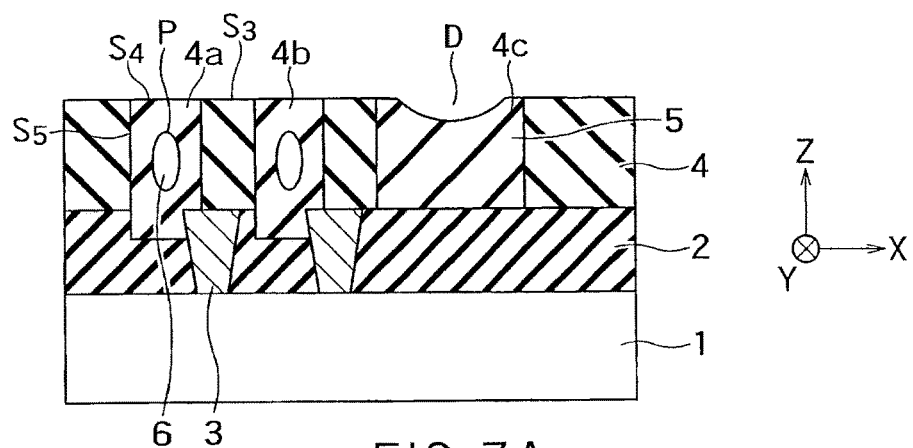
Figure 7B:
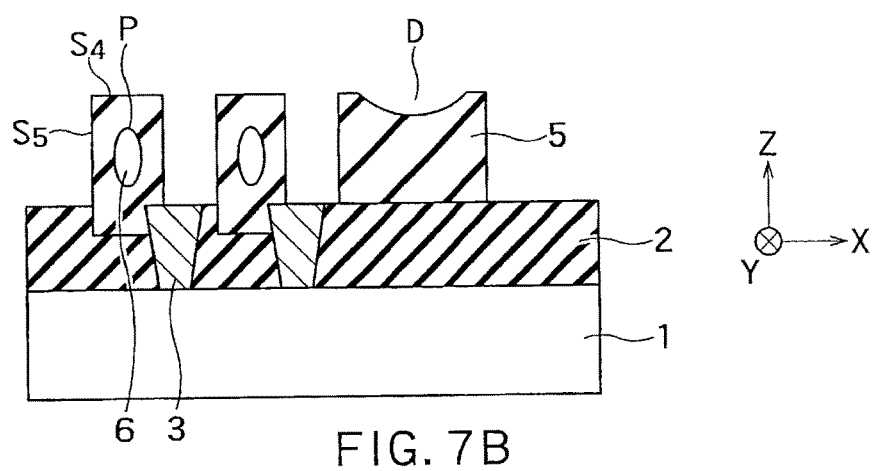
Figure 7C:
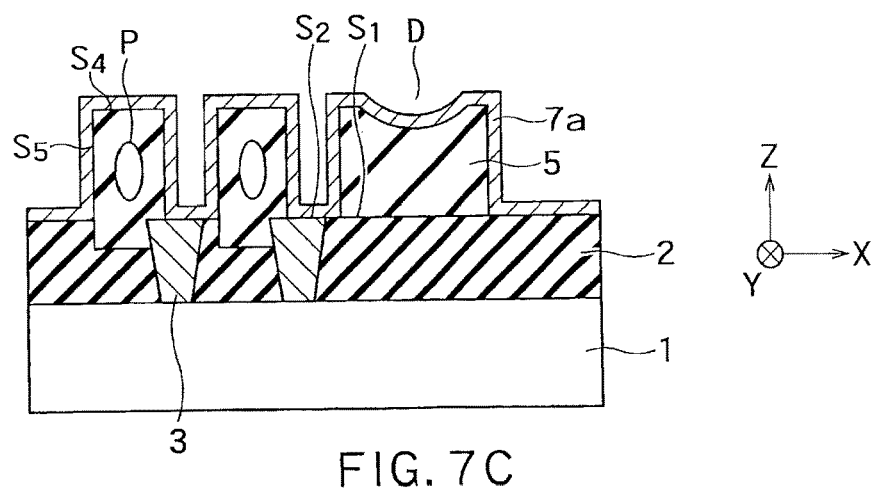
Figure 8A:
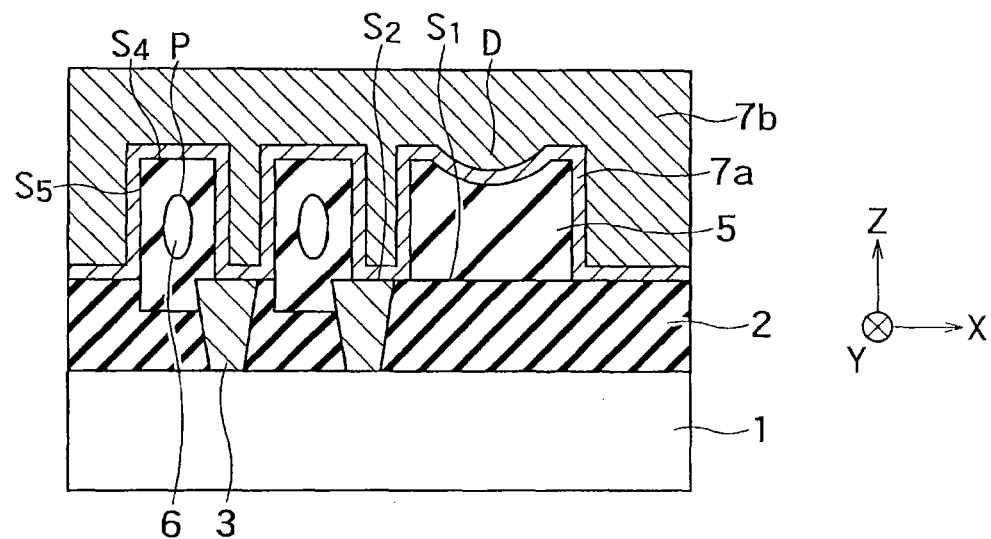
Figure 8B:
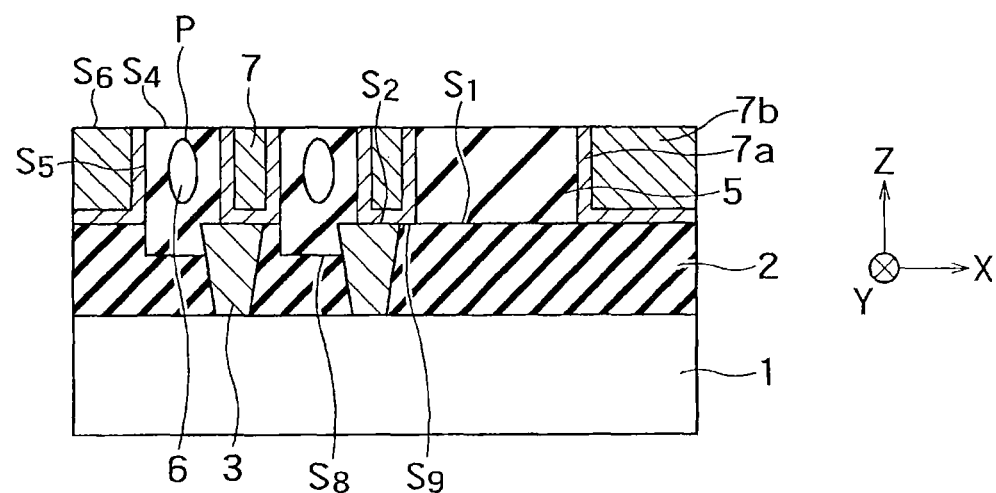

Next, a second insulator 5 is formed on the whole surface of the substrate 1 (FIG. 6C). Consequently, the openings 4a to 4c are filled with the second insulator 5, and air gaps 6 are formed in the openings 4a and 4b. The second insulator 5 in the present embodiment is formed so as to contact the first insulator 2 and the contact plugs 3, and has a lower face $S_8$ lower than the upper face $S_2$ of each contact plug 3.

Next, processes of FIGS. 7A to 8B are performed in a similar manner to the processes of FIGS. 2A to 3B. Consequently, interconnects 7 are formed on the contact plugs 3. However, the lower face $S_8$ of the second insulator 5 in the present embodiment is lower than a lower face $S_9$ of each interconnect 7.

The misalignment in lithography in the process of FIG. 6B is allowable if the misalignment is within a range in which the interconnects 7 are formed at positions where the interconnects 7 contact the contact plugs 3.

According to the present embodiment, the air gaps 6 can be formed between the interconnects 7 while preventing the dissolution and disappearance of the interconnects 7, similarly to the first embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first insulator;
   a plug provided in the first insulator;
   a second insulator provided on the first insulator, the second insulator including an air gap, a lower face of the second insulator being lower than an upper face of the plug; and
   an interconnect provided on the plug, the interconnect including a barrier layer that is in contact with the second insulator and extends along a vertical direction from an upper face of the first insulator to an upper face of the second insulator,
   wherein an upper end of the air gap is lower than an upper face of the interconnect and the upper face of the second insulator, and a lower end of the air gap is higher than a lower face of the interconnect and the upper face of the first insulator.

2. The device of claim 1, wherein the lower face of the second insulator is lower than the lower face of the interconnect.

3. The device of claim 1, wherein the second insulator is in contact with the plug.

4. The device of claim 1, wherein
   the barrier layer includes a portion provided on the upper face of the plug, and
   the interconnect includes a conductive material layer provided on the portion of the barrier layer.

* * * * *